United States Patent [19]

Yoshihara

[11] Patent Number: 4,670,365
[45] Date of Patent: Jun. 2, 1987

[54] PHOTOMASK AND METHOD OF FABRICATION THEREOF

[75] Inventor: Koichi Yoshihara, Tokyo, Japan

[73] Assignee: NEC Corporation, Japan

[21] Appl. No.: 791,585

[22] Filed: Oct. 25, 1985

[30] Foreign Application Priority Data

Oct. 29, 1984 [JP] Japan .................. 59-227369

[51] Int. Cl.⁴ ............................................. G03F 9/00
[52] U.S. Cl. ...................................... 430/5; 430/321;
427/38; 428/704
[58] Field of Search .............. 430/5, 321, 4; 427/38;
428/426, 704

[56] References Cited

FOREIGN PATENT DOCUMENTS 56-16136  2/1981  Japan ...................... 430/5
56-40828  4/1981  Japan ...................... 430/5

OTHER PUBLICATIONS

Long et al, "The Boriding of Chromium Photomask ...", Thin Solid Films, 64 (3), 1979, pp. 433-438.
Wilson et al, Ion Beams with Applications to Ion Implantation, John Wiley & Sons, New York, 1973.

Primary Examiner—John E. Kittle
Assistant Examiner—José G. Dees
Attorney, Agent, or Firm—Laff, Whitesel, Conte & Saret

[57] ABSTRACT

A photolithographic mask for use in the fabrication of semiconductor integrated circuit devices, comprising a transparent substrate having a major surface, and a metallic film formed on the major surface of the transparent substrate and impermeable to ultraviolet rays having wavelengths within a predetermined range, wherein the metallic film is doped with sulfur ions to provide a reduced angle of contact between the surface of the film and a body of pure water to achieve an increased degree of adaptability of the photomask to cleaning with pure water when the photomask is put to repeated use over a prolonged period of time.

11 Claims, 5 Drawing Figures

PHOTOMASK AND METHOD OF FABRICATION THEREOF

FIELD OF THE INVENTION

The present invention relates to masks for use in photolithographic processing steps during manufacture of semi-conductor integrated circuit devices. The present invention also relates to a method of fabricating such photolithographic masks.

BACKGROUND OF THE INVENTION

Photolithographic masks (hereinafter referred to simply as photomasks) for use in the manufacture of semiconductor integrated circuit devices are largely broken down to two major categories, one including metal or hard masks and the other including emulsion type masks. Metal or hard photomasks use coatings of metallic chromium, chromium oxides, iron oxides, silicon oxides or any combinations of these on glass substrates. At least one coating of any of these materials is either deposited or sputtered onto the surface of the substrate. On the other hand, emulsion type photomasks are fabricated by application of emulsified silver halogenides to the surfaces of glass substrates. Of these two types of photomasks, the former, viz., metal photomasks are presently more widely accepted than the latter for their abilities to provide higher degrees of resolution and mechanical durability.

When such a metal photomask is put to repeated use, the mask is contaminated from various sources. These sources of contaminants include the air-born organic chemicals which tend to be deposited on the mask during storage of the mask, photoresist materials with which the mask is to be used during contact development processing, and fine particles which tend to stick to the mask during transportation and handling of the mask. While metal photomasks provide longer lifetimes than emulsion type photomasks for their enhanced mechanical durability, they thus require elaborate cleanups when used repeatedly over extended periods of time. Various techniques are operable for the cleaning of contaminated metal photomasks, including chemical rinsing processes using surfactants or organic or inorganic acids, scrubbing with use of sponges or brushes, and physical purging processes using supersonic waves. The chemicals which can be used for chemical rinsing purposes include nitric acid, sulfuric acid, a chromic acid mixture and an aqueous solution of hydrogen peroxide. While each of these cleaning techniques is useful to a greater or lesser extent when used independently or in combination with any of other techniques, none of them has proved fully acceptable for the cleaning of metal photomasks. Failure to completely clean photomasks inevitably leads to reduction in the yields achievable of the manufacture of semiconductor integrated circuit devices.

In the meantime, it is known that a solid object depends for its adaptability to cleaning on the surface state of the object or, more specifically, on the angle of contact between the surface of the object and a body of liquid which, in this instance, is typically pure water. The smaller the contact angle between the object and the body of pure water, the higher the efficiency at which the object can be cleaned with water. With this in mind, we have made extensive studies on the adaptability of photomasks to cleaning with pure water and have found that a photomask has an increased degree of adaptability to cleaning with water and is capable of maintaining such adaptability over a theoretically unlimited period of time when the metallic film of the mask is doped with ions of sulfur.

It is, accordingly, a prime object of the present invention to provide an improved photomask which has an increased degree of adaptability to cleaning with water over a practically unlimited period of time.

It is another important object of the present invention to provide an improved photomask which can be used repeatedly for the manufacture of semiconductor integrated circuit devices over an extended period of time.

It is still another important object of the present invention to provide an improved photomask which is adapted to achieve an enhanced yield and a reduced cost of production of semiconductor integrated circuit devices.

It is, yet, still another important object of the present invention to provide a method of fabricating such an improved photomask.

SUMMARY OF THE INVENTION

In accordance with one important aspect of the present invention, there is provided a photolithographic mask comprising a substantially transparent substrate having a major surface, and a metallic film formed on the major surface of the transparent substrate and substantially impermeable to ultraviolet rays having wavelengths within a predetermined range, wherein the improvement comprises the aforesaid metallic film being doped with sulfur ions.

In accordance with another outstanding aspect of the present invention, there is provided a method of fabricating a photolithographic mask, comprising preparing a substantially transparent substrate having a major surface, forming on the major surface of the transparent substrate a metallic film substantially impermeable to ultraviolet rays having wavelengths within a predetermined range, and doping the metallic film with sulfur ions. The sulfur ions may be either implanted into the metallic film or may be introduced into the film by maintaining a layer of element sulfur in direct contact with the film and thermally activating the layer of the element sulfur for causing sulfur ions to migrate and sink into the film.

BRIEF DESCRIPTION OF THE DRAWINGS

The features and advantages of a metal type photomask according to the present invention and a method of fabricating such a photomask will be more clearly appreciated from the following description taken in conjunction with the accompanying drawings in which.

DESCRIPTION OF THE PREFERRED EMBODIMENTS

Figure 1A:
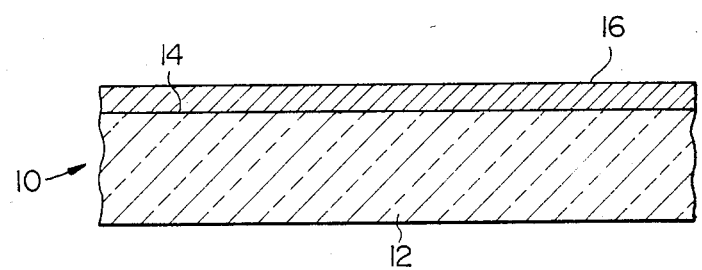
FIG. 1A is a schematic cross sectional view showing a blank of a preferred form of metal type photomask embodying the present invention.
Figure 1B:
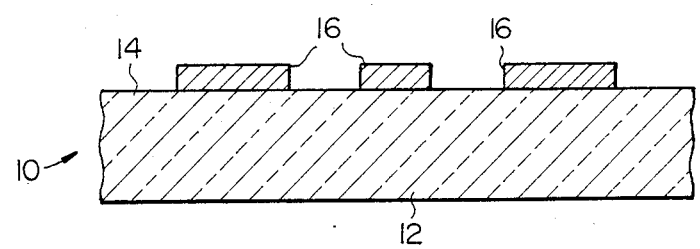
FIG. 1B is a schematic cross sectional view showing photomask prepared from the mask blank shown in FIG. 1A.

In FIG. 1A of the drawings, a blank of a photomask 10 to prepare a photomask embodying the present invention is shown comprising a transparent substrate 12 having a mirror-finished flat or uniplanar major surface 14. The transparent substrate 12 is constructed of glass having a low thermal expansion coefficient such as typically silica glass (fused silica) or soda-lime glass. On the major surface 14 of this transparent substrate 12 is formed a film 16 of metallic chromium which is either deposited or sputtered on the surface of the film 16 and which is shown as having already been patterned. If desired, the metallic chromium film 16 in the shown embodiment may be replaced by a film of any other material which is substantially impermeable or reflective to ultraviolet rays having wavelengths of a predetermined range. As well known in the art, such a material may be selected from the group consisting of chromium oxides, iron oxides, and silicon oxides as well as the metallic chromium used in the shown embodiment. For use in a photolithographic process of forming a semiconductor integrated circuit device, the photomask blank 10 is patterned to leave selected portions thereof on the substrate 12 as shown in FIG. 1B. The physical configuration per se of the photomask 10 shown in FIG. 1B is similar to any of known photomasks and, as such, no further description regarding the detailed construction of the photomask will be herein incorporated. The above mentioned predetermined range of the wavelengths of ultraviolet rays typically includes the wavelength of the ultraviolet beam to be used for the development of the photoresist film during fabrication of integrated circuit devices as also well known in the art.

Figure 2A:
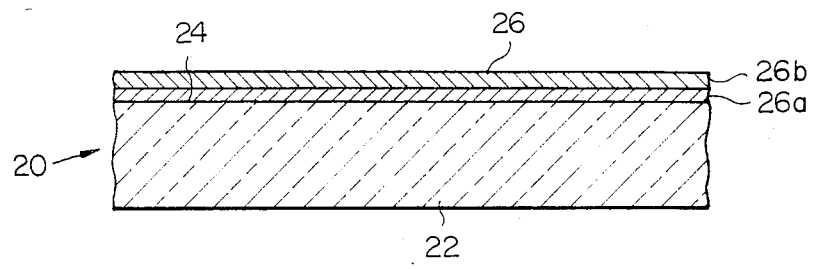
FIG. 2A is a view similar to FIG. 1A but shows a blank of another preferred form of multi-layer metal type photomask embodying the present invention.

The metallic film 16 is herein shown, by way of example, as consisting of a single layer but, if desired, such a film may be replaced by a film consisting of two or more layers of different materials. Where it is desired that such a multi-layer film be composed of two layers, one of the layers consists of a material selected from the group consisting of metallic chromium, chromium oxides, iron oxides and silicon oxides and the other layer consists of another material selected from this group. FIG. 2A of the drawings shows such a metal mask blank 20.

Referring to FIG. 2A, the photomask blank 20 comprises a transparent substrate 22 having a mirror-finished major surface 24 and also constructed of silica glass or soda-lime glass. The substrate 22 has formed on its major surface 24 a metallic film 26 consisting of coextensive two layers 26a and 26b. The first layer 26a is formed of metallic chromium deposited or suputtered onto the major surface 24 of the substrate 22. On the other hand, the second layer 26b is formed of chromic oxide ($Cr_2O_3$) typically deposited on the surface of the first layer 26a and serves as a low reflective layer. The first layer 26a may be about 600Å to about 800Å and the second layer 26b may be about 200Å to about 400Å. The photomask blank 20 is also patterned to leave selected portions thereof on the substrate 22 as shown in FIG. 2B.

Though not shown in the drawings, the metallic film of a photomask or mask blank according to the present invention may further include a third layer which typically intervenes between the substrate 22 and the first layer 26a of metallic chromium. Such a third layer may be of chromic oxide to provide another low reflective layer or of another material (such as indium oxide) to provide an anti-electrostatic layer. Alternatively, the third layer may be of metallic chromium which is either deposited or sputtered on the surface of the substrate. Where two layers of chromium are thus used, one of the chromium layers may be formed by deposition and the other by sputtering.

Figure 2B:
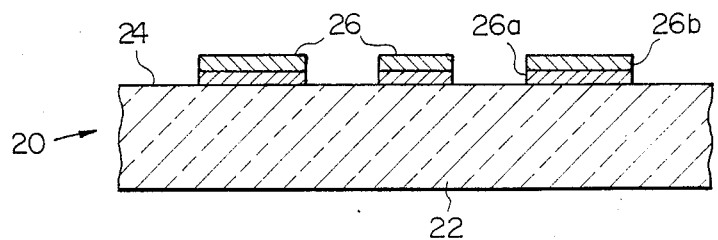
FIG. 2B is a view similar to FIG. 1B but shows a photomask prepared from the mask blank shown in FIG. 2A.

The physical configuration per se of the photomask blank or photomask 10 as described with reference to FIGS. 1A and 1B or the photomask blank or photomask 20 as described with reference to FIGS. 2A and 2B is similar to any of known photomasks and, as such, no further description regarding the detailed construction thereof will be herein incorporated.

In accordance with the present invention, the single layer metallic film 16 of the photomask 10 shown in FIG. 1B or the uppermost, viz., second layer 26b of the multi-layer photomask 20 shown in FIG. 2B is doped with sulfur ions. The sulfur ions may be introduced into the film 16 or the second layer 26b of the film 26 with use of ion implantation techniques. For this purpose, sulfur dioxide gas ($SO_2$) may be used as a source of sulfur ions, in which instance ions of sulfur may be injected into the film 16 or the second layer 26b of the film 26 with acceleration energy of 100 keV to 200 keV and a dosage of $10^{13}$ ions/cm$^2$ to $10^{16}$ ions/cm$^2$. Alternatively, the film 16 or the second layer 26b of the film 26 may be doped from a solid layer (not shown) of element sulfur held in direct contact with the metallic film 16 or the layer 26b formed on the transparent substrate 12 or 22. In this instance, the layer of the element sulfur is thermally activated to cause sulfur ions to migrate and sink into the film 16 or the second layer 26b of the film 26 from the sulfur layer until the density of the ions introduced into the film 16 or layer 26b reaches a desired value.

Figure 3:
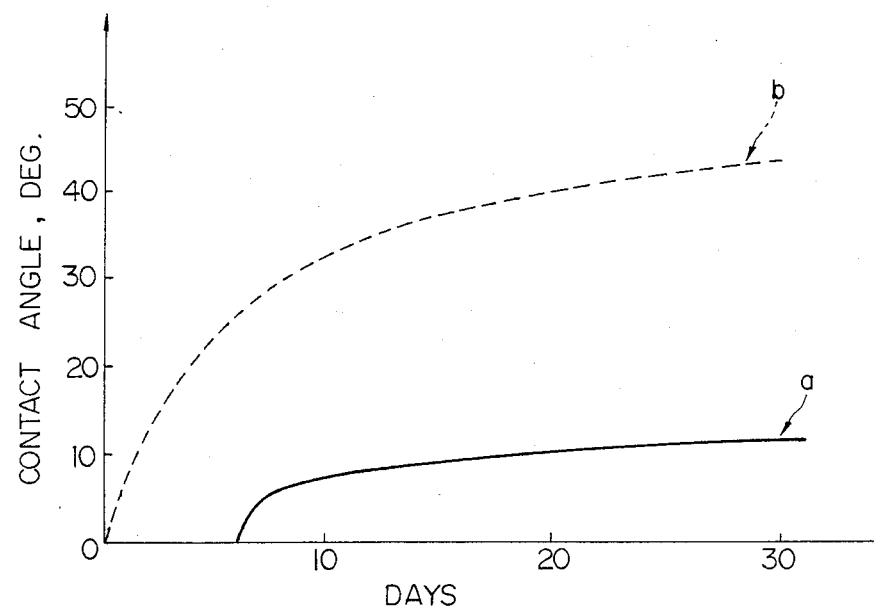
FIG. 3 is a graphic representation of the variation, in terms of days, of the angle of contact in degrees between the surface of a metallic film and a body of pure water for the photomask prepared in accordance with the present invention (curve a) and a conventional metal type photomask (curve b).

FIG. 3 of the drawings shows the variation, in terms of days, of the angle of contact in degrees between the surface of the film 16 or 26 and a body of pure water. Curve a in full line indicates the variation in the contact angle for the sulfur doped film 16 or 26 forming part of the photomask 10 or 20 embodying the present invention, while curve b in broken line indicates the variation in the contact angle for an undoped metallic film which forms part of a conventional metal type photomask. From a comparison between these curves a and b, it will be readily seen that the amount of variation in the angle of contact of the sulfur doped film 16 or 26 with a body of pure water is far less than the amount of variation for the undoped metallic film. This directly means that the sulfur doped film 16 or 26 is capable of maintaining excellent wetting performance over an extended period of time when the mask is put to repeated use. As a matter of fact, tests conducted with specimens of the photomask with the doped metallic film 16 or 26 prepared in accordance with the present invention showed that the surface of the film could be cleaned satisfactorily by having recourse to a most simple cleaning process such as scrubbing with pure water after the mask is used for an etching operation. Such results of the tests contrast with the results of the tests conducted with conventional photomasks, which revealed that the contamination of the masks proceeds at extremely higher rates when the masks are put to repeated use and that considerably heavy cleanups are required for the recovery of the initial cleanliness of the mask. Such heavy cleaning steps are quite likely to result in a breaking of the masks, damage to the mask patterns and unwanted increases in the reflectivity of the metallic films, all these apparently giving rise to a reduction in the lifetime of the photomasks.

What is claimed is:

1. A photolithographic mask comprising
   (a) a substantially transparent substrate having a major surface, and
   (b) a patterned metallic film formed on said major surface of the transparent substrate; said film being substantially impermeable to ultraviolet rays having wavelengths within a predetermined range,
   said metallic film being doped with sulfur ions for increasing an adaptability of the photolithographic mask to cleaning with water.

2. A photolithographic mask as set forth in claim 1, in which said metallic film consists of a single layer of a material selected from the group consisting of metallic chromium, chromium oxides, iron oxides, and silicon oxides.

3. A photolithographic mask as set forth in claim 1, in which said metallic film comprises at least two layers including a first layer formed directly on said major surface from a first material selected from the group consisting of metallic chromium, chromium oxides, iron oxides, and silicon oxides, and a second layer which is formed on said first layer, said second layer consisting of a second and different material selected from said group, said second layer being said metallic film which is doped with said sulfur.

4. A method of fabricating a photolithographic mask, comprising
   (a) preparing a substantially transparent substrate having a major surface,
   (b) forming on said major surface of the substrate a patterned metallic film substantially impermeable to ultraviolet rays having wavelengths within a predetemined range, and
   (c) doping said metallic film with sulfur ions for increasing an adaptability of the photolithographic mask to cleaning with water.

5. A method as set forth in claim 4, in which said metallic film is formed on said major surface of the substrate by forming on said surface a single layer of a material selected from the group consisting of metallic chromium, chromium oxides, iron oxides, and silicon oxides.

6. A method as set forth in claim 4, in which said metallic film is formed on said major surface of the substrate by forming on said surface a first layer of a material selected from the group consisting of metallic chromium, chromium oxides, iron oxides and silicon oxides and forming a second layer of a different material selected from said group and overlying said first layer, said second layer being said metallic film which is doped with said sulfur ions.

7. A method as set forth in either claim 4 or 5, in which said sulfur ions are implanted into said film.

8. A method as set forth in claim 6, in which said sulfur ions are implanted into said second layer.

9. A method as set forth in claim 4 or 5, in which said sulfur ions are introduced into said film by maintaining a layer of element sulfur in direct contact with said film and thermally activating the layer of the element sulfur for causing sulfur ions to migrate into said film.

10. A method as set forth in claim 6, in which said sulfur ions are introduced into said second layer by maintaining a layer of element sulfur in direct contact with said said second layer and thermally activating the layer of the element sulfur for causing sulfur ions to migrate and sink into said second layer.

11. A method as set forth in claim 4, 5 or 6, in which said ions of sulfur are injected into said film with the acceleration energy within the range of from 100 keV to 200 keV and a dosage within the range of from $10^{13}$ ions/cm$^2$ to $10^{16}$ ions/cm$^2$.

* * * * *